(12) United States Patent
Sakurai et al.

(10) Patent No.: US 6,447,879 B1
(45) Date of Patent: Sep. 10, 2002

(54) ELECTRONIC DEVICE AND METHOD OF MANUFACTURING THE SAME

(75) Inventors: Masatoshi Sakurai; Katsuyuki Naito, both of Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 08/928,408

(22) Filed: Sep. 12, 1997

(30) Foreign Application Priority Data

Sep. 17, 1996 (JP) .............................................. 8-245047

(51) Int. Cl.⁷ .......................... B32B 3/00; H05B 33/00; H01L 31/00; H01M 6/00
(52) U.S. Cl. ........................ 428/161; 428/141; 428/690; 428/917; 313/504; 313/506; 257/183; 257/653; 136/255; 359/265; 429/122
(58) Field of Search ................................. 428/690, 917, 428/141, 161; 313/504, 506; 257/183, 653; 136/255; 359/265; 429/122

(56) References Cited

U.S. PATENT DOCUMENTS 4,442,185 A * 4/1984 Skotheim 4,742,867 A * 5/1988 Walsh
5,426,005 A * 6/1995 Eschbach
6,001,889 A * 12/1999 Lefebvre ..................... 521/82

FOREIGN PATENT DOCUMENTS

JP  5-50869  10/1986

OTHER PUBLICATIONS

B. O'Regan et al., "A Low–Cost, High–Efficiency Solar Cell Based On Dye–Sensitized Colloidal $TiO_2$ Films", Nature, 353:737–739 Oct. 1991.

Y. Cao et al., "Efficient, Fast Response Light–Emitting Electrochemical Cells: Electroluminescent and Solid Electrolyte Polymers with Interpenetrating Network Morphology", Appl. Phys. Lett., 68(23) :3218–3220 Jun. 1996.

* cited by examiner

Primary Examiner—Marie Yamnitzky
(74) Attorney, Agent, or Firm—Finnegan, Henderson, Farabow, Garrett & Dunner, L.L.P.

(57) ABSTRACT

An organic thin film device in which, as a junction interface shape between an organic thin film and an adjacent layer, a sectional contour shape of a device interface having a Hausdorff dimension, as one fractal dimension, falling within the range $1.5 \leq D \leq 2.0$ is formed by defining the Hausdorff dimension and its scale length.

10 Claims, 5 Drawing Sheets

ELECTRONIC DEVICE AND METHOD OF MANUFACTURING THE SAME

BACKGROUND OF THE INVENTION

The present invention relates to electronic devices, e.g., an organic solar cell, an organic EL device, an emitter, an electrochromic display device, a light-emitting electrochemical device, a thin film secondary battery, and a gel actuator, for performing energy conversion in the junction interface between different substances, and a method of manufacturing the same.

When conventional organic solar cells perform energy conversion, incident light produces excitons in a light absorption layer, and these excitons diffuse to the junction interface to perform charge separation. Therefore, as many excitons as possible must reach the junction interface.

Since, however, the actual diffusion length of excitons is at most a few nm, excitons produced in a region far from the junction interface cannot reach the interface. On the other hand, the light absorption coefficient of an organic absorption layer made from an organic dye is approximately $10^{-4}$ $cm^{-1}$. Therefore, excitons are believed to be produced in a region to a depth of 1 $\mu$m from the light-receiving surface. From these facts, it is expected that in an organic solar cell having a flat junction interface, only about a few % of produced excitons actually contribute to photoelectric conversion. At present, the conversion efficiency of organic solar cells having a flat junction interface is at most about 1%.

Recently, a wet organic solar cell using an optical reaction of a ruthenium complex on the surface of a fine titanium oxide grain with a grain size of 100 nm, or less has been developed, and a photoelectric conversion efficiency of about 10% is obtained. However, since the system of the device is of wet type, the device still has a problem in portability.

Also, in organic EL devices enthusiastically studied for practical use in recent years, carrier injection from an electrode into an organic thin film is a rate-determining step. Therefore, an interface structure by which as many carriers as possible can be injected from an organic thin film is desired.

In electrochromic display devices or light-emitting electrochemical devices, ions existing in one of layers on the both sides of the interface are moved to the other by applying a voltage across the two terminals of the device, thereby performing display or emitting light. In these devices, the path through which the ions reach the interface is a rate-determining step. Accordingly, the current display or light emission rate is at most a few seconds to a few tens of seconds.

Field emission devices make use of a cold cathode capable of emitting electrons at around room temperature by sharpening the tips of the emitter electrode. Sharpening the emitter electrode requires a mask process. A spint type cold cathode having one sharp portion on the emitter electrode surface for each opening is a representative example of emitter electrodes obtained by a mask process. Another method of obtaining pointed portions of the emitter electrode is to disperse fine particles on the emitter surface and use these fine particles as masks during the course of mask processing. In this method a plurality of pointed portions are formed on the emitter electrode surface for one opening.

In gel actuators, diffusion of molecules to the gel surface is a rate-determining step, so the current driving speed is at most a few seconds to a few tens of seconds.

In thin film secondary batteries, the amount per unit area of ions stored on the electrode surface during charging and the efficiency of diffusion of ions from the electrode surface have an influence on the electrode capacitance density. Therefore, it is effective to form an electrode surface with a structure efficient for ion diffusion, as well as to increase the electrode surface area.

These conventional organic thin film devices as described above have the following problems.

In organic solar cells with a solid junction structure having a flat junction shape, the thickness of a light absorption layer necessary to effectively absorb incident light differs from the length of a free path through which excitons produced by the light absorption can reach the interface. This adversely affects improvements of the photoelectric conversion efficiency. Also, wet organic solar cells in which fine particles form an interface have a problem in portability although a high conversion efficiency can be obtained.

In organic EL devices, the efficiency of injection of electrons or holes from an electrode into an organic thin film is low, and this has an adverse effect on improvements of the luminous efficiency.

In field emission devices, mask process is required for sharpening the emitter electrodes, especially a spint type cold cathode has one sharpened portion for each opening. A process for removing fine particles is required at the end of mask process in which the fine particles are used. Thus the emitter electrode having as many sharpning portion as possible in each opening, can be produced with minimum steps, is desired.

In electrochromic display devices, light-emitting electrochemical devices, and gel actuators having a flat interface shape, the rate of diffusion of ions or organic molecules to the interface has an adverse effect on improvements of the device operating rate. In electrochromic display devices, light-emitting electrochemical devices, and gel actuators in which the interface has a fine particle structure, it is impossible to effectively secure the path of diffusion of ions or organic molecules to the interface. This adversely affects improvements of the device operating rate.

Furthermore, in thin film secondary batteries having an electrode surface shape with disordered micropores, the ion diffusion path is inefficient. This adversely affects improvements of the electrode capacitance density.

BRIEF SUMMARY OF THE INVENTION

The present invention has been made in consideration of the above conventional problems and has as its object to provide an electronic device whose practicality is improved by efficiently performing energy conversion between an organic thin film and an adjacent layer or electron emission from an emitter.

It is another object of the present invention to provide a manufacturing method effective to obtain this device.

Firstly, the present invention provides an organic thin film device comprising a first electrode, an organic material containing layer formed on the first electrode, and a second electrode layer formed on the organic material containing layer, wherein a contour shape of an interface to an adjacent layer in a section of the organic material containing layer has a Hausdorff dimension D falling within the range $1.5 \leq D \leq 2.0$.

Secondly, the present invention provides a method of manufacturing an organic thin film device comprising a first electrode, a first organic material containing layer formed on the first electrode, a second organic material containing layer formed on the first organic material containing layer and a second electrode formed on the second organic material containing layer, wherein the first and second organic material containing layers are formed by mixing two types of organic materials and separating the organic materials by applying at least one of an electric field, a magnetic field, irradiation of light, a temperature gradient, and a centrifugal force, and a contour shape of an interface in a section of the first and second organic material containing layers has a Hausdorff dimension D falling within the range $1.5 \leq D \leq 2.0$.

Thirdly, the present invention provides a field emission device comprising a substrate, an electron emitter layer regularly formed on the substrate, an insulator layer formed in a region except for the emitter on the substrate, and a gate electrode layer formed on the insulator layer, wherein a Hausdorff dimension D of a sectional contour shape of a surface of the electron emitter layer falls within the range $1.7 < D \leq 2.0$ at a scale length of 100 nm to 1 $\mu$m.

In the present invention, an interface having a desired Hausdorff dimension and a desired scale length is formed in a thin film for performing energy conversion. Consequently, it is possible to improve the energy conversion efficiency of an electronic device, e.g., improve the photoelectric conversion efficiency of an organic solar cell and the luminous efficiency of an organic EL device, lower the electron emission voltage of an emitter, and also improve the display rate of an electrochromic display device, the light emission rate of a light-emitting electro-chemical device, the operating rate of a gel actuator, and the electrode capacitance density and the current density of a thin film secondary battery.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Figure 1:
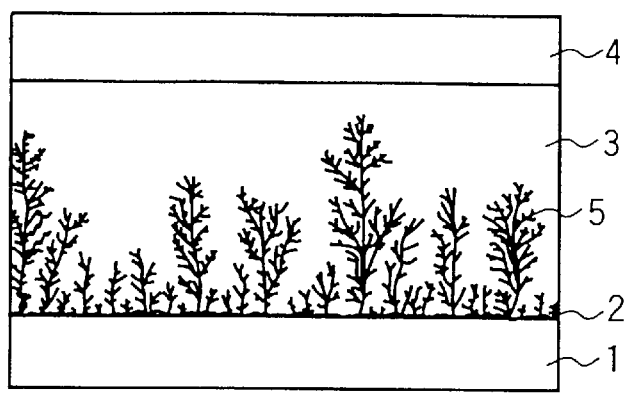
FIG. 1 is a schematic view showing the sectional shape of an example of an organic thin film device of the present invention.

To solve the above problems, the present invention improves the interface between a layer containing an organic substance and an adjacent layer or improves the surface of an emitter.

According to the first aspect of the present invention, there is provided an organic thin film device comprising a first electrode, an organic material containing layer formed on the first electrode, and a second electrode layer formed on the organic material containing layer, wherein a contour shape of an interface to an adjacent layer in a section of the organic material containing layer has a Hausdorff dimension D falling within the range $1.5 \leq D \leq 2.0$.

The contour shape is preferably an aggregation of dendritic structures.

The invention according to the first aspect is roughly divided into a photoelectric conversion apparatus and an electrochemical apparatus described below.

The photoelectric conversion apparatus according to the first aspect is a photoelectric conversion apparatus comprising a first electrode, an organic material containing layer formed on the first electrode, and a second electrode layer formed on the organic material containing layer, wherein a contour shape of an interface between the organic material containing layer and an adjacent layer in a section of the organic material containing layer has a Hausdorff dimension D falling within the range $1.7 \leq D \leq 2.0$, and the organic material containing layer adsorbs or emits electrons at the interface.

The electrochemical apparatus according to the first aspect is an electrochemical apparatus comprising a first electrode, an organic material containing layer formed on the first electrode, and a second electrode layer formed on the organic material containing layer, wherein a contour shape of an interface to an adjacent layer in a section of the organic material containing layer has a Hausdorff dimension D falling within the range $1.5 \leq D \leq 2.0$, and the organic material containing layer adsorbs or emits ions at the interface.

Examples of the photoelectric conversion apparatus according to the first aspect are the first and second preferred embodiments described below.

According to the first preferred embodiment, an organic solar cell is provided as an example of the photoelectric conversion apparatus. This organic solar cell comprises a first electrode, a first organic layer formed on the first electrode, a second organic layer formed on the first organic layer, and a second electrode formed on the second organic layer, wherein the first and second organic layers have a continuous interface, and a contour shape of the interface in a section of the first and second organic layers has a Hausdorff dimension D falling within the range $1.7 \leq D \leq 2.0$ at a scale length of 100 nm.

The interface preferably has a shape composed of a set of fine pyramids having a bottom surface width of 10 $\mu$m or more.

According to the second preferred embodiment, an organic EL device is provided as another example of the photoelectric conversion apparatus. This organic EL device comprises a first electrode, an n-type organic layer formed on the first electrode, a p-type organic layer formed on the n-type organic layer, and a second electrode formed on the p-type organic layer, wherein at least one of a first interface between the first electrode and the n-type organic layer and a second interface between the second electrode and the p-type organic layer is continuous, and a contour shape of at least one of the first and second interfaces, at least one of which is continuous, in a section of the organic EL device has a Hausdorff dimension D falling within the range $1.7 \leq D \leq 2.0$ at a scale length of 10 nm.

Examples of the electrochemical apparatus according to the first aspect are the third to sixth preferred embodiments described below.

According to the third preferred embodiment, an electrochromic display device is provided as an example of the electrochemical apparatus.

This electrochromic display device comprises a first electrode, an electrolyte layer formed on the first electrode, a polymer layer formed on the electrolytic layer, and a second electrode formed on the polymer layer, wherein the electrolyte layer and the polymer layer have a continuous interface, and a contour shape of the interface in a section of an electrochromic layer has a Hausdorff dimension D falling within the range $1.7 \leq D \leq 2.0$ at a scale length of 10 $\mu$m.

According to the fourth preferred embodiment, a light-emitting electrochemical device is provided as another example of the electrochemical apparatus. This light-emitting electrochemical device comprises a first electrode, a mixed layer of a polymer and an electrolyte formed on the first electrode, and a second electrode formed on the mixed layer, wherein the first electrode and the mixed layer have a continuous interface, and a contour shape of the interface in a section of the light-emitting electrochemical device has a Hausdorff dimension D falling within the range $1.7 \leq D \leq 2.0$ at a scale length of 10 $\mu$m.

According to the fifth preferred embodiment, a gel actuator is provided as still another example of the electrochemical apparatus.

This gel actuator comprises a stacked structure including a first electrode, an electrolyte layer formed on the first electrode, a polymer gel layer formed on the electrolyte layer, and a second electrode formed on the polymer gel layer, and an elastic material formed around the stacked structure, wherein a contour shape of an interface between the electrolyte layer and the polymer gel layer in a section of the gel actuator has a Hausdorff dimension D falling within the range $1.5 \leq D \leq 2.0$ at a scale length of 1 $\mu$m.

According to the sixth preferred aspect of the present invention, there is provided a thin film secondary battery as still another example of the electrochemical apparatus.

This thin film secondary battery comprises a first electrode, an electrolyte layer formed on the first electrode, a high polymer layer formed on the electrolyte layer, and a second electrode formed on the high polymer layer, wherein a contour shape of an interface of the high polymer layer to the electrolyte layer in a section of the high polymer layer is a set of dendritic structures 10 $\mu$m or more in height and has a Hausdorff dimension D falling within the range $1.7 \leq D \leq 2.0$ at a scale length of 10 $\mu$m.

According to the second aspect of the present invention, there is provided a method of manufacturing the organic thin film device according to the first aspect.

This manufacturing method is a method of manufacturing an organic thin film device comprising a first electrode, a first organic material containing layer formed on the first electrode, a second organic material containing layer formed on the first organic material layer, and a second electrode formed on the second organic material containing layer, wherein the first and second organic material containing layers are formed by mixing two types of organic materials and separating the organic materials by applying at least one of an electric field, a magnetic field, irradiation of light, a temperature gradient, and a centrifugal force, and a contour shape of an interface in a section of the first and second organic material containing layers has a Hausdorff dimension D falling within the range $1.5 \leq D \leq 2.0$.

According to the third aspect of the present invention, there is provided an electronic device to be used as a field emission device, comprising an electron emitter layer formed into a predetermined pattern on a substrate, an insulator layer formed in a region except for the electron emitter layer on the substrate, and a gate electrode layer formed on the insulator layer, wherein a Hausdorff dimension D of a sectional contour shape of a surface of the electron emitter layer falls within the range $1.7 \leq D \leq 2.0$ at a scale length of 100 nm to 1 $\mu$m.

The surface of the electron emitter layer is desirably an aggregation of dendritic structures.

Also, the electronic device according to the third aspect can be preferably used as a display apparatus.

Embodiments of the present invention will be described below with reference to the accompanying drawings.

FIG. 1 is a schematic view showing the sectional shape of an example of the organic thin film device according to the first aspect of the present invention. This device uses two organic material containing layers. As shown in FIG. 1, this organic thin film device includes a first electrode 1, a first organic substance containing layer 2, a second organic substance containing layer 3, and a second electrode layer 4. In this device, energy conversion is performed in the junction interface between the organic substance containing layer 2 and the adjacent layer 3. A contour shape in the section of this junction interface 5 is, for example, an aggregation of dendritic structures as shown in FIG. 1, and is a fractal shape having self-similarity. This dendritic structure preferably has at least one stage of branching. In the present invention, an energy conversion device in which a Hausdorff dimension describing the shape of the device is defined is obtained.

A Hausdorff dimension is explained in Hideki Takayasu, "Fractal", chapter one, Asakura Shoten. That is, several methods exist as methods of describing fractal dimensions of graphic forms. A Hausdorff dimension is a fractal dimension which measures an object by fragmenting it into squares.

More specifically, a space (plane) is divided into cubic (square) cells whose side is r, and the number N(r) of cells including a portion of a shape as an object is calculated. Using r and N(r), a Hausdorff dimension D is given by the following formula (1).

$$N(r) \cong r^{-D} \tag{1}$$

The value of D takes an integral value of 1 or 2 when the object is a uniform structure such as a straight line or a plane, respectively. When the object is a complicated curve, for example, the value of D takes a nonintegral value between one and two dimensions and thereby functions as an index indicating the complexity of a structure as an object. This Hausdorff dimension is intrinsic in the size (scale length) of cubes (squares) dividing a space (plane). Accordingly, by evaluating the Hausdorff dimension of an actual solid surface shape by using various scale lengths, the shape of the surface can be evaluated for each of these scale lengths.

An actual method of measuring a Hausdorff dimension will be described below. For example, sectional images of the interface of a device at various magnifications are obtained by some means, such as a transmission electron microscope or a confocal laser microscope, by which a sectional shape is obtained as a real image. These images are loaded into a computer to extract the sectional contour shape of the interface. This sectional contour shape is fragmented into squares having a side of a certain fixed length, and the number of squares containing a portion of the contour is counted in each image. The number of squares and the length of the side of the square are plotted on logarithmic axes. The slope of the obtained curve is a Hausdorff dimension at the length of the side, i.e., the scale length. This operation is performed for images of one interface at various magnifications to calculate the Hausdorff dimension of the interface shape of that device.

A surface whose Hausdorff dimension takes a value close to 2 at a certain scale length has a large roughness of a size close to that scale length. This surface has a larger space apart from the surface by the space length than a flat surface.

A surface having a fixed Hausdorff dimension in a wide scale length region has no singular point in any portion of the scale length region. Therefore, particles can uniformly diffuse in all directions of the surface. Accordingly, shortlife particles in a surface-interface reaction can be more efficiently captured by increasing the value of a scale length meeting the free path of the particles and the value of a Hausdorff dimension near the scale length. Also, the rate and efficiency of the capture of particles to the surface can be increased by increasing the value of a scale length meeting the diffusion coefficient of the particles and a desired response speed and the value of a Hausdorff dimension near the scale length.

A structure whose sectional contour has a high Hausdorff dimension can also be formed by an interface containing fine particles. However, grain boundaries exist in an interface containing fine particles and prevent carriers or ions produced in the interface from being effectively transported.

In the present invention, as a method of forming an interface having a predetermined Hausdorff dimension, thin film growth or etching can be performed under a supersaturation condition. One example of a non-equilibrium phenomenon such as thin film growth or etching is, as described in Hideki Takayasu ed., "Fractal Science", chapter two, Asakura Shoten, a change in an interface structure caused by the balance between the interface instability and the surface tension. Under a certain supersaturation or larger, the effect of the interface in stability is larger than that of the surface tension, so the interface can become a structure in which roughness at a fixed wavelength is grown. To control a Hausdorff dimension at a desired scale length in a device interface, therefore, it is necessary to hold the interface formation conditions in a certain fixed supersaturation state. An interface formation method capable of controlling the degree of nonequilibrium is junction formation performed after surface formation by field polymerization or etching, or junction interface formation from a mixed state by separation.

The preferred modes of the present invention described previously will be described in more detail below.

In an organic solar cell according to the present invention, a first organic material containing layer and a second organic material containing layer have a continuous interface, and a Hausdorff dimension D of the contour shape of the interface in a section of the first and second organic material containing layers is $1.7 \leq D \leq 2.0$ at a scale length of 100 nm, preferably 100 nm to 1 µm, and more preferably 10 nm to 1 µm. In the organic solar cell having this interface structure, a light absorption layer exists over 1 µm or more in the direction of depth, so incoming light is well absorbed. Since the interface exists near the scale length defined as above, excitons produced by incident light can also reach the interface to perform charge separation before disappearing by recombination. In this structure, the roughness of the interface is preferably 1 µm or more in the direction of depth.

One can assume that the value of a Hausdorff dimension at a scale length of interest is almost independent of the value of a Hausdorff dimension at another largely different scale length. Accordingly, when diffusion of two or more types of particles is involved in the interface reaction and their respective scale lengths and Hausdorff dimensions to be calculated are different, a plurality of Hausdorff dimensions can be set at different scale lengths in one interface.

For example, when an organic solar cell has a continuous interface and the Hausdorff dimension D of the sectional contour shape of the interface is $1.7 \leq D \leq 2.0$ at a scale length of 100 nm, preferably 10 to 100 nm and $1.0 \leq D \leq 1.4$ at a scale length of 1 µm, which is longer than the wavelength of visible light, preferably 1 to 10 µm, scattering of incident light can be controlled independently of the structure, necessary to capture excitons, in a region of 10 to 100 nm which is the scale length of the free path of excitons. That is, when the interface has a structure composed of a set of fine pyramids whose bottom surface width is 10 µm or more and a fine structure whose Hausdorff dimension D of the sectional contour shape of the interface is $1.7 \leq D \leq 2.0$ in a region of 100 nm, preferably 10 to 100 nm is formed on the pyramid surface, incident light is scattered a plurality of number of times in the interface, and produced excitons can be effectively captured.

In an organic EL device, it is necessary that in a section of an electrode and a substance containing an organic material, the Hausdorff dimension D of the contour shape of the interface be $1.7 \leq D \leq 2.0$ at a scale length of 10 nm, preferably 10 to 100 nm. Consequently, electrons or hole carriers can be efficiently injected from the electrode.

An electrochromic display device or an electrochemical light-emitting device has a continuous interface. The Hausdorff dimension D of the contour shape of the interface between an electrolyte layer and a polymer layer in a section of the electrochromic display device or the interface between a mixture of a polymer and an electrolyte and an electrode in a section of the light-emitting electrochemical device is $1.7 \leq D \leq 2.0$ at a scale length of 10 µm, preferably 1 to 10 µm, and more preferably 1 to 100 µm. Consequently, in these devices ions diffuse in the electrolyte at nearly the defined scale length and reach the interface. This allows a high-speed display or light emission.

In a gel actuator, the Hausdorff dimension D of the contour shape of the interface between a high polymer gel and an electrolyte in a section of the actuator is $1.5 \leq D \leq 2.0$ at a scale length of 1 µm, preferably 1 to 10 µm, and more preferably 100 nm to 10 µm. Consequently, molecules diffuse in the electrolyte at nearly the defined scale length and reach the gel surface, making a high-speed operation feasible.

In a thin film secondary battery, the interface contour shape on the positive or negative electrode side of a high polymer layer in a section of the battery is a set of dendritic structures 10 µm or more in height. The Hausdorff dimension D of this contour shape is $1.7 \leq D \leq 2.0$ at a scale length of 10 µm, preferably 1 to 10 µm, more preferably 1 to 100 µm, and most preferably 100 nm to 100 µm. Since the battery has a high Hausdorff dimension over a broad range of scale lengths, the surface has a self-similar structure. As a consequence, it is possible not only to increase the electrode surface area but also to efficiently secure the ion diffusion path during charging and discharging. This leads to an increase in the electrode capacitance density.

As an example of a method of forming the organic thin film device described above, the present invention uses a method of obtaining a wet junction structure by first growing a thin film having a conductive polymer dendritic surface structure by field polymerization at a certain fixed voltage and then forming a junction with a liquid containing an electrolyte.

Figure 2:
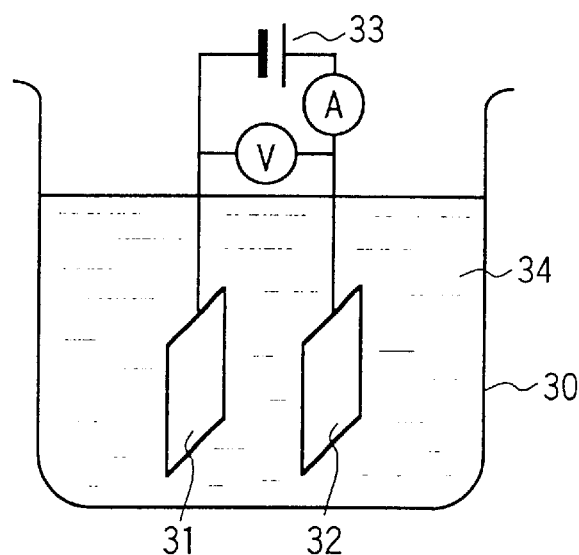
FIG. 2 is a schematic view showing an example of an apparatus used in electrolytic polymerization.

FIG. 2 is a schematic view showing an apparatus used in field polymerization. As shown in FIG. 2, the apparatus used in field polymerization includes an electrolytic cell 30, an electrolytic solution 34 placed in the electrolytic cell 30 and containing a monomer, a work electrode (anode) 31 and a counter electrode (cathode) 32 dipped into the electrolytic solution 34, and a power supply 33 arranged between the two electrodes. When field polymerization is performed by using this apparatus, a conductive polymer having a dendritic surface structure is formed on the surface of the work electrode 31. A desired layer is stacked, if necessary, on the work electrode on which the conductive polymer is formed, and the counter electrode is placed on the desired layer and junctioned.

A dendritic structure is a pillar, string, or planar structure having at least one stage of branching on the surface of a grown film. The larger the number of stages of branching of a dendritic structure, the higher the Hausdorff dimension of the structure.

Examples of the conductive polymer are polypyrrole, polyphenylene, polyaniline, and poly-N-vinylcarbazole. Examples of the electrolyte are perchlorate, borate tetrafluoride, and phosphate hexafluoride. This method is particularly effective in the manufacture of, e.g., an organic solar cell, a gel actuator, an electrochromic display device, a light-emitting electrochemical device, and an organic EL device.

An electrolyte portion can also be gelled by mixing a photopolymerization material in the electrolyte portion when a junction is formed and performing polymerization by light or a heat treatment after the junction is formed. This eliminates a leak of the electrolyte portion which is a problem in wet junction devices, so a high portability can be obtained. Examples of the material for performing gelation are polyvinyl alcohol, polyacrylic acid, and polyacrylamide.

In addition to the above device formation method, a method of initially forming a solid junction structure is also possible. That is, in the present invention, a layer in which two types of substances for forming a junction are mixed is arranged between a pair of electrodes, and these two substances are separated by applying at least one of an electric field, a magnetic field, irradiation of light, a temperature gradient, and a centrifugal force to the layer. The result is a junction interface in which the Hausdorff dimension D of the contour shape of the interface between an organic material containing layer and its adjacent layer in a section of an organic thin film device is $1.5 \leq D \leq 2.0$.

Additionally, by performing mixing at a temperature higher than the melting point of at least one of the substances, uniform mixing is performed and a steep interface is formed upon separation.

Furthermore, a junction interface whose Hausdorff dimension D varies by 0.3 or more at different scale lengths from 10 nm to 100 µm by simultaneously or sequentially applying at least two of an electric field, a magnetic field, irradiation of light, a temperature gradient, and a centrifugal force. In an organic solar cell, scattering of incident light can be controlled independently of the structure, necessary to capture excitons, in a region of 10 to 100 nm as the scale length of the free path of excitons. Also, since the device is made only from solids, the device has high portability. As the material for forming a solid junction, a crystalline or amorphous organic molecule is used. Examples of the crystalline material are various metal phthalocyanines, perylenetetracarboxylic acid, polycyclic aromatic groups such as perylene and coronene, and a charge-transfer complex such as TTF and TCNQ. Examples of the amorphous material are $Alq_3$, diamine, various oxadiazoles, TTPAE, BCXEB, TCXEB, and TCPE. Chem 1 to Chem 7 below show the structural formulas representing the molecular structures of the above amorphous materials.

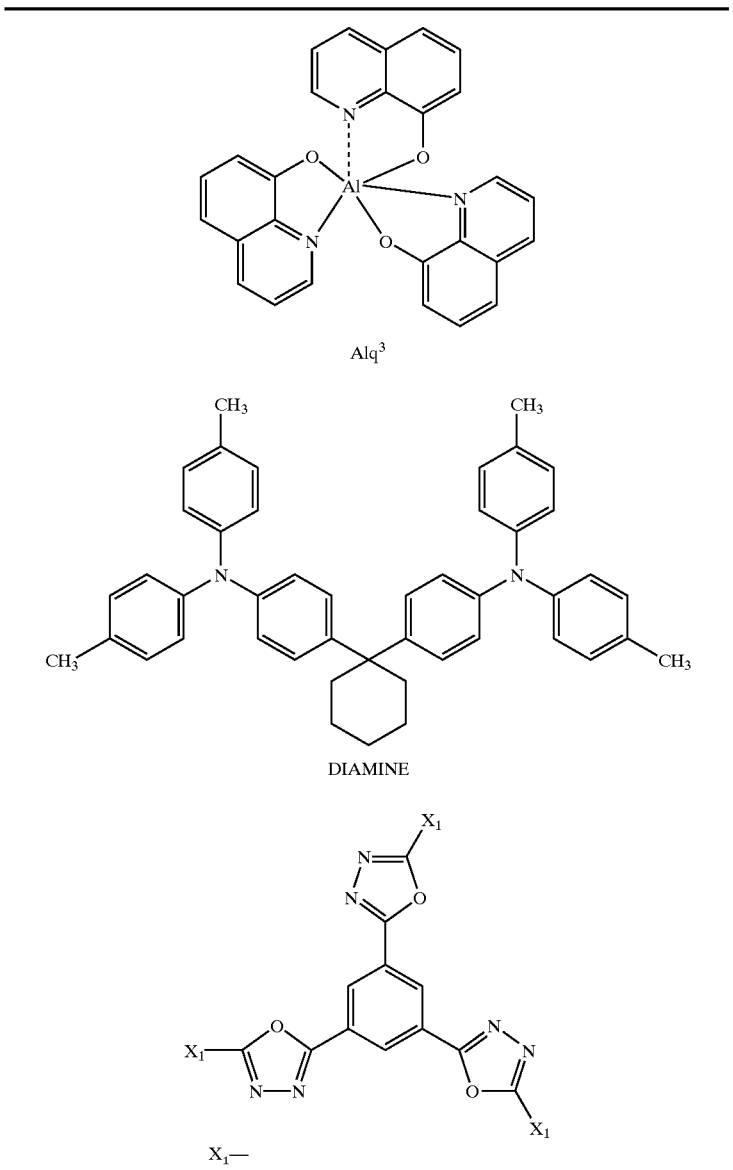
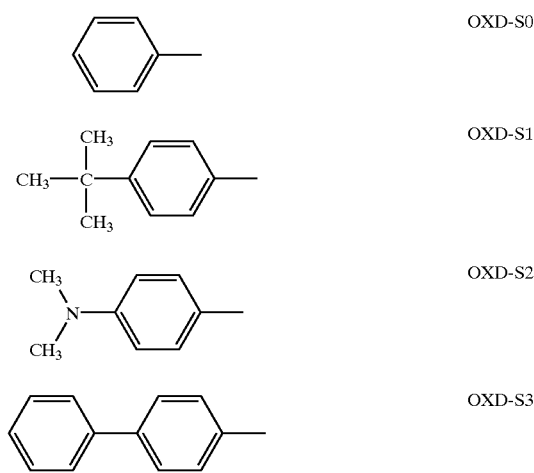

-continued
| | |
|---|---|
| 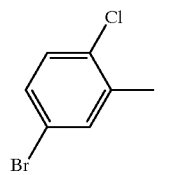 | OXD-S4 |
| 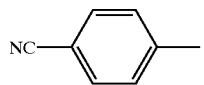 | OXD-S5 |
| 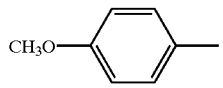 | OXD-S6 |
| 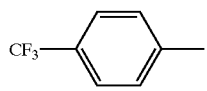 | OXD-S7 |
| 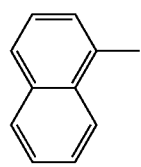 | OXD-S8 |
| 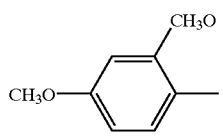 | OXD-S9 |
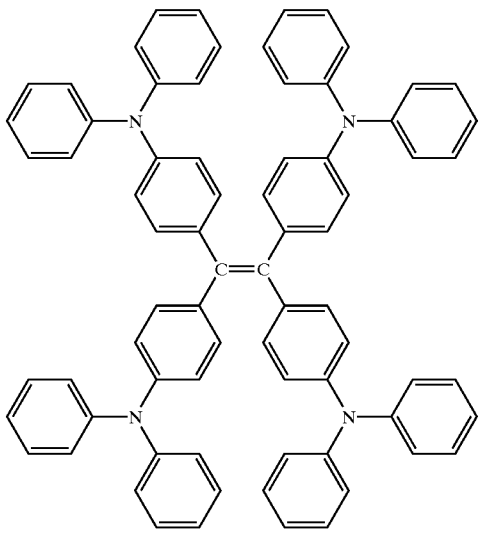
TTPAE
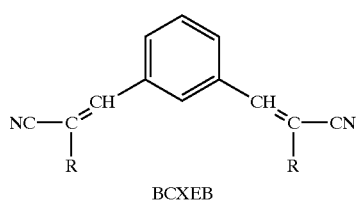
BCXEB -continued

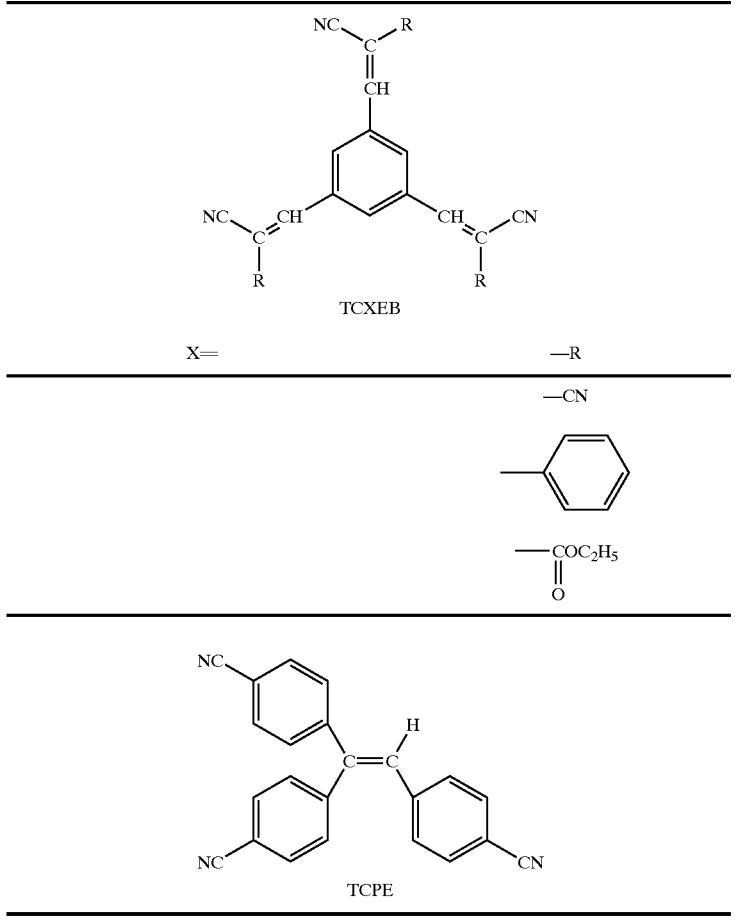

According to the sixth aspect of the present invention, in a field emission device, the Hausdorff dimension D of the sectional contour shape of the surface of an electron emitter layer in an opening is $1.7 \leq D \leq 2.0$ at a scale length of 100 nm to 1 μm, and the sectional contour shape is preferably an aggregation of dendritic structures. Consequently, a single opening can have multiple electron emission points, and low-voltage electron emission is possible. Additionally, a field emission device can be formed at a low cost because it is unnecessary to perform a conventional microprocess or fine particle scattering-removal process.

The present invention will be described in detail below by presenting practical examples of the individual preferred modes of the invention.

EXAMPLE 1

Figure 3:
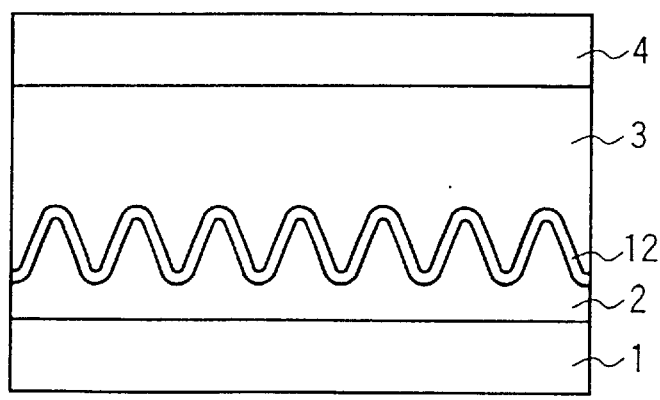
FIG. 3 is a schematic view showing the structure of the main components of an organic solar cell according to the first example of the present invention.

FIG. 3 is a schematic view showing the structure of the main parts of one example of the organic solar cell according to the first preferred embodiment of the present invention.

As shown in FIG. 3, this organic solar cell has a stacked structure including a Nesa glass substrate 1, a p-type polypyrrole film 2, an Mg phthalocyanine coating layer (not shown), and an aluminum electrode 4 formed on the Mg phthalocyanine coating layer via an aqueous electrolyte solution layer 3 containing phosphate hexafluoride. The surface of the p-type polypyrrole film 2 on the side of the aqueous electrolyte solution layer has dendritic structures a few μm high.

This organic solar cell was manufactured as follows.

First, a p-type polypyrrole film 2 was grown on a Nesa glass substrate 1 by electrolytic polymerization by using the Nesa glass substrate 1 as a work electrode (positive electrode), a platinum electrode as a counter electrode (negative electrode), a saturated calomel electrode as a reference electrode, and phosphate hexafluoride as an electrolyte. The conditions of electrolytic polymerization were so set that the applied voltage was 5.0V and the film thickness of the polypyrrole film 2 was about 1 μm. When a section of the resultant polypyrrole film 2 was observed with a TEM, dendritic structures 12 a few μm high were found as shown in FIG. 3.

Figure 4:
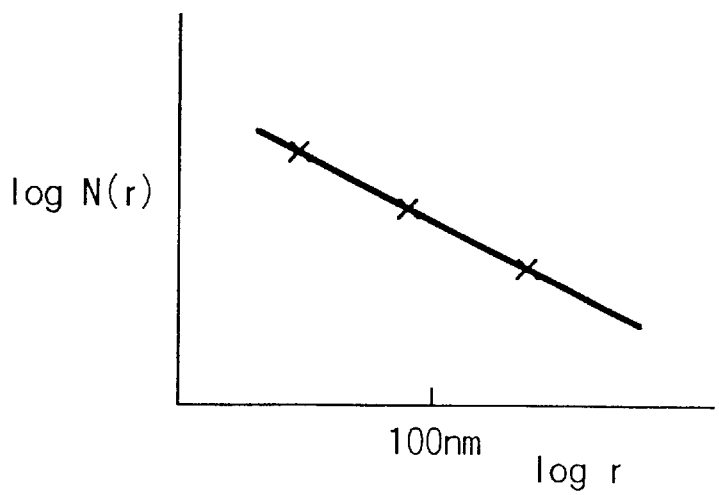
FIG. 4 is a graph analyzing the Hausdorff dimension of the junction interface of the organic thin film device in FIG. 3.

FIG. 4 is a logarithmic graph showing the relationship between a length r of a side of a square, obtained by dividing a section or a plane in accordance with Hausdorff dimension calculations performed for a section of the polypyrrole film by a computer, and the number of squares including the surface of the polypyrrole film as an object. As shown in FIG. 4, the Hausdorff dimension D of the surface of the grown polypyrrole film was 1.8±0.1 at a scale length of 100 nm.

The surface of this high polymer film 2 was coated with an acetonitrile solution of Mg phthalocyanine, forming an Mg phthalocyanine coating layer about 10 nm thick.

After the Mg phthalocyanine coating layer was dried, an aluminum electrode 4 was formed at a distance of about 1 μm from the surface via an aqueous electrolyte solution 3 containing phosphate hexafluoride, thereby forming a wet organic solar cell.

The resultant wet organic solar cell operates by absorption of incident light in the Mg phthalocyanine coating layer and resultant production of excitons, charge separation of the excitons on the surface of the Mg phthalocyanine coating layer and electron transfer to phosphorus hexafluoride ions, electron transfer of the phosphorus hexafluoride ions on the surface of the aluminum electrode, diffusion of the phosphorus hexafluoride ions to the aluminum electrode surface and subsequent electron transfer on the aluminum electrode surface, hole transfer from the Mg phthalocyanine layer to the Nesa glass through the polypyrrole film, hole transfer to the aluminum electrode and the Nesa glass, and current supply from the aluminum electrode and the Nesa glass to the outside. The Hausdorff dimension D of the sectional shape of the polypyrrole film surface can take a value within the range $1.0 \leq D \leq 2.0$ at a scale length of 100 nm. Since D takes a value of $1.8 \pm 0.1$, the rate of diffusion of the phosphorus hexafluoride ions from the surface of the Mg phthalocyanine coating layer to the aluminum electrode is improved. This results in an improved photoelectric conversion efficiency.

This wet organic solar cell was irradiated with light at a light quantity of 750 mW/cm² by using a pseudo solarlight source manufactured by Wakomu Co. The resultant photoelectric conversion efficiency was measured by using Source Measure Unit 236 available from Cayslay Co. Also, the portability of the device was measured by a liquid leakage test run on a shaking machine. The results are shown in Table 1 to be presented later.

EXAMPLE 2

Figure 5:
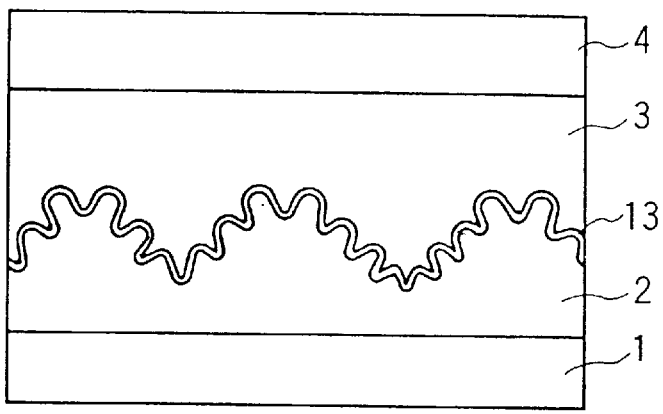
FIG. 5 is a schematic view showing the structure of the major components of an organic solar cell according to the second example of the present invention.

FIG. 5 is a schematic view showing the structure of the major components of another example of the organic solar cell according to the first preferred embodiment of the present invention.

As shown in FIG. 5, this organic solar cell has a stacked structure including a Nesa glass substrate 1, a p-type polypyrrole film 2, an Mg phthalocyanine coating layer (not shown), and an aluminum electrode 4 formed on the Mg phthalocyanine coating layer via an aqueous electrolyte solution layer 3 containing phosphate hexafluoride. The surface of the p-type polypyrrole film 2 on the side of the aqueous electrolyte solution layer has dendritic structures 13 of a few μm high.

In Example 2, a p-type polypyrrole film 2 was grown on a Nesa glass 1 following the same procedure as in Example 1 except that the field polymerization conditions were so set that the applied voltage was set to 3.0V when the polypyrrole film thickness was 0 to 1 μm and 6.0V when the polypyrrole film thickness was 1 to 1.1 μm. When a section of the resultant polypyrrole film 2 was observed with a TEM, dendritic structures 13 of a few μm high were found.

Hausdorff dimension calculations were performed for a section of the dendritic structure 13 by a computer. Consequently, since the applied voltage was abruptly changed in two steps, the Hausdorff dimension at a scale length of 10 nm was $1.8 \pm 0.1$, and that at a scale length of 1 μm was $1.3 \pm 0.1$.

Following the same procedure as in Example 1, the surface of this high polymer film 2 was coated with an acetonitrile solution of Mg phthalocyanine, forming an Mg phthalocyanine coating layer about 10 nm thick.

After the Mg phthalocyanine coating layer was dried, an aluminum electrode 4 was formed at a distance of about 1 μm from the surface via an aqueous electrolyte solution 3 containing phosphate hexafluoride following the same procedure as in Example 1, thereby forming a wet organic solar cell.

The resultant wet organic solar cell operates by absorption of incident light in the Mg phthalocyanine coating layer and resultant production of excitons, charge separation of the excitons on the surface of the Mg phthalocyanine coating layer and electron transfer to phosphorus hexafluoride ions, electron transfer of the phosphorus hexafluoride ions on the surface of the aluminum electrode, diffusion of the phosphorus hexafluoride ions to the aluminum electrode surface and subsequent electron transfer on the aluminum electrode surface, hole transfer from the Mg phthalocyanine layer to the Nesa glass through the polypyrrole film, hole transfer to the aluminum electrode and the Nesa glass, and current supply from the aluminum electrode and the Nesa glass to the outside. The Hausdorff dimension D of the sectional contour shape of the polypyrrole film surface can take a value of $1.0 \leq D \leq 2.0$. Since D takes a value of $1.3 \pm 0.1$ at a scale length of 10 nm, the probability of absorption of incident light to the Mg phthalocyanine coating layer is improved. Furthermore, since D takes a value of $1.8 \pm 0.1$ at a scale length of 10 nm, the rate of diffusion of the phosphorus hexafluoride ions from the surface of the Mg phthalocyanine coating layer to the aluminum electrode is improved. This results in an improved photoelectric conversion efficiency.

Following the same procedure as in Example 1, this wet organic solar cell was irradiated with light at a light quantity of 750 mW/cm², and the resultant photoelectric conversion efficiency and the portability of the device were measured. The results are shown in Table 1 to be presented later.

EXAMPLE 3

Figure 6:
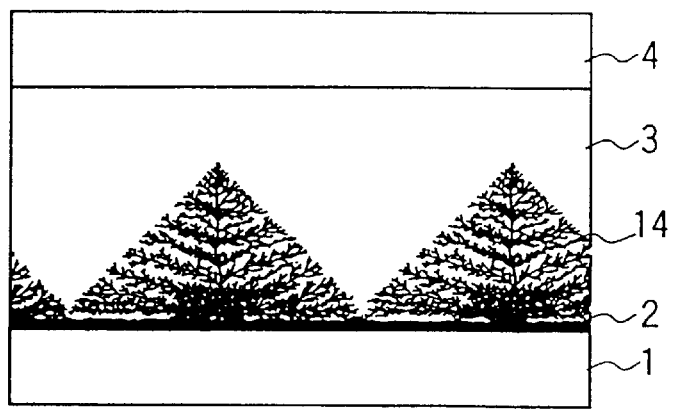
FIG. 6 is a schematic view showing the structure of the major parts of a wet solar cell according to the third example of the present invention.

FIG. 6 is a schematic view showing the structure of the major parts of still another example of the organic solar cell according to the first preferred embodiment of the present invention.

As shown in FIG. 6, this organic solar cell has a stacked structure including a Nesa glass substrate 1, a p-type polypyrrole film 2, an Mg phthalocyanine coating layer 5, and an aluminum electrode 4 formed via an aqueous electrolyte solution layer 3 containing phosphate hexafluoride. The surface of the p-type polypyrrole film 2 on the side of the aqueous electrolyte solution layer has a plurality of pyramidal projections 14 of 10 μm high having myriad micropores.

This organic solar cell was manufactured as follows.

First, a p-type polypyrrole film having a flat surface was grown on a Nesa glass substrate 1 by electrolytic polymerization by using the Nesa glass substrate 1 as a work electrode (positive electrode), a platinum electrode as a counter electrode (negative electrode), a saturated calomel electrode as a reference electrode, and phosphate hexafluoride as an electrolyte. The conditions of electrolytic polymerization were so set that the applied voltage was 3.0V and the film thickness of the polypyrrole film was about 10 μm.

The surface of the resultant substrate was pushed against a mold having an array of pyramidal recesses 10 μm wide and 10 μm high at a temperature of 200° C., and molding was performed to form innumerable fine pyramids having micropores. This substrate 1 was etched in a solution of $H_2SO_4$ to form innumerable micropores of about 10 nm in the pyramid surfaces, thereby forming a polypyrrole film 2 having myriad fine pyramids with micropores.

Figure 7:
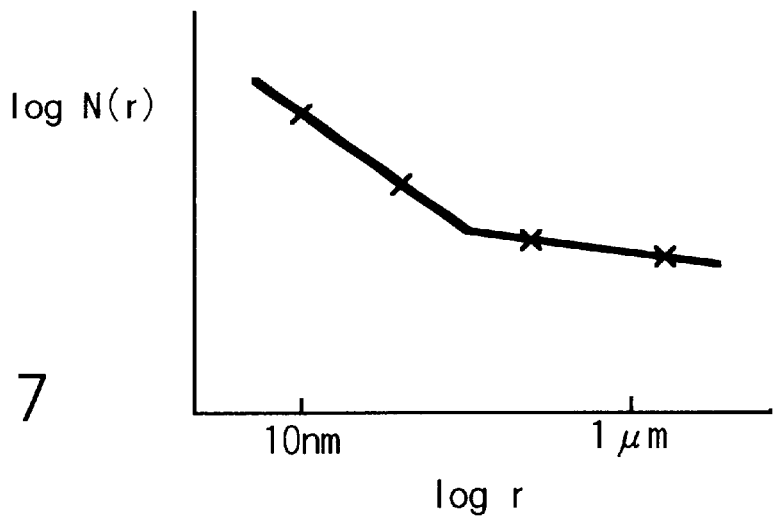
FIG. 7 is a graph analyzing the Hausdorff dimension of the junction interface of the organic thin film device in FIG. 6.

FIG. 7 is a logarithmic graph showing the relationship between a length r of a side of a cube, obtained by dividing a section or a plane in accordance with Hausdorff dimension calculations performed for a section of the polypyrrole film by a computer, and the number of cubes including the surface of the polypyrrole film as an object. As shown in FIG. 7, the Hausdorff dimension D of the sectional contour shape of the sectional contour shape of the surface of the grown polypyrrole film was 1.8±0.1 at a scale length of 100 nm and 1.2±0.1 $\mu$m at a scale length of 1 $\mu$m.

Following the same procedure as in Example 1, the surface of this high polymer film was coated with an acetonitrile solution of Mg phthalocyanine, forming an Mg phthalocyanine coating layer about 10 nm thick.

After the Mg phthalocyanine coating layer was dried, an aluminum electrode 4 was formed at a distance of about 1 $\mu$m from the surface via an aqueous electrolyte solution 3 containing phosphate hexafluoride following the same procedure as in Example 1, thereby forming a wet organic solar cell.

The resultant wet organic solar cell operates by absorption of incident light in the Mg phthalocyanine coating layer and resultant production of excitons, charge separation of the excitons on the surface of the Mg phthalocyanine coating layer and electron transfer to phosphorus hexafluoride ions, diffusion of the phosphorus hexafluoride ions to the aluminum electrode surface and subsequent electron transfer on the aluminum electrode surface, hole transfer from the Mg phthalocyanine layer to the Nesa glass through the polypyrrole film, and current supply from the aluminum electrode and the Nesa glass to the outside. Since the polypyrrole film surface has fine pyramid structures, the probability of absorption of incoming light to the Mg phthalocyanine coating layer is improved. Furthermore, since the Hausdorff dimension D of the sectional contour shape of the polypyrrole film surface takes a value of 1.8±0.1 at a scale length of 100 nm, the rate of diffusion of the phosphorus hexafluoride ions from the surface of the Mg phthalocyanine coating layer to the aluminum electrode is improved. This results in an improved photoelectric conversion efficiency.

Following the same procedure as in Example 1, this wet organic solar cell was irradiated with light at a light quantity of 750 mW/cm$^2$, and the resultant photoelectric conversion efficiency and the portability of the device were measured. The results are shown in Table 1 to be presented later.

EXAMPLE 4

Equal amounts of polyvinyl alcohol and polyacrylic acid were mixed in the aqueous electrolyte solution portions of the organic solar cells obtained in Examples 1, 2, and 3, and a heat treatment was performed at around 100° C. for 2 hr to cause the electrolytic solution portions to gel. The resultant gel organic solar cells eliminated a leak from the electrolyte portion without decreasing the photoelectric conversion efficiency, i.e., had high portability.

EXAMPLE 5

Figure 8:
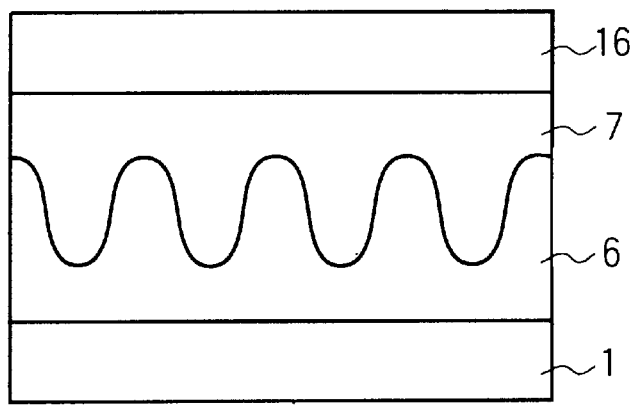
FIG. 8 is a schematic view showing the structure of the major components of an organic solar cell according to the fifth example of the present invention.

FIG. 8 is a schematic view showing the structure of the main components of still another example of the organic solar cell according to the first preferred embodiment of the present invention.

As shown in FIG. 8, this organic solar cell has a stacked structure including a Nesa glass substrate 1, a BCPEB (bis-cyanophenylethylbenzene) film 6, a TTPAE (tetrakistriphenylaminoethylene) film 7, and an aluminum electrode 16.

In a section of this organic solar cell, the interface between BCPEB and TTPAE has dendritic structures 50 nm high.

This organic solar cell was manufactured by the following manufacturing method according to the fourth aspect of the present invention.

First, equal amounts of powders of BCPEB (melting point 140° C.) and TTPAE (melting point 297° C.) were mixed, and the mixture was sandwiched between a Nesa glass substrate 1 and an aluminum substrate 16. The spacing between the two substrates was set to 1 $\mu$m by using a spacer (not shown). The resultant structure was heated to 300° C. at which both BCPEB and TTPAE melted, and cooled to room temperature at a rate of 1° C./sec, thereby obtaining an organic solar cell. During the cooling, a voltage of +10V was applied to the Nesa glass substrate 1 while the temperature fell from 297° C. to 140° C.

After the cooling, the structure between the two substrates was observed at room temperature by a sectional TEM. Consequently, a layered structure of aluminum electrode/BCPEB layer/TTPAE layer/Nesa glass was found. The Hausdorff dimension of the contour shape of the interface in a section of this organic solar cell was 1.8±0.1 at a scale length of 100 nm.

The resultant organic solar cell operates due to light absorption by BCPEB or TTPAE and subsequent production of excitons, diffusion of the produced excitons and disappearance of the excitons by recombination, arrival of the diffused excitons at the interface between BCPEB and TTPAE, charge separation of the excitons in the interface and subsequent production of electrons and holes, transfer of the electrons to the aluminum electrode through BCPEB, and current supply by the holes to the Nesa glass substrate through TTPAE. The Hausdorff dimension D of the sectional contour shape of the junction interface between BCPEB and TTPAE can take a value of 1.0<D<2.0 at a scale length of 100 nm. Since D takes a value of 1.8±0.1, the probability of arrival of the excitons at the interface between BCPEB and TTPAE is improved. This results in an improved photoelectric conversion efficiency.

Following the same procedure as in Example 1, this wet organic solar cell was irradiated with light at a light quantity of 750 mW/cm$^2$, and the resultant photoelectric conversion efficiency and the portability of the device were measured. The results are shown in Table 1 to be presented later.

EXAMPLE 6

Figure 9:
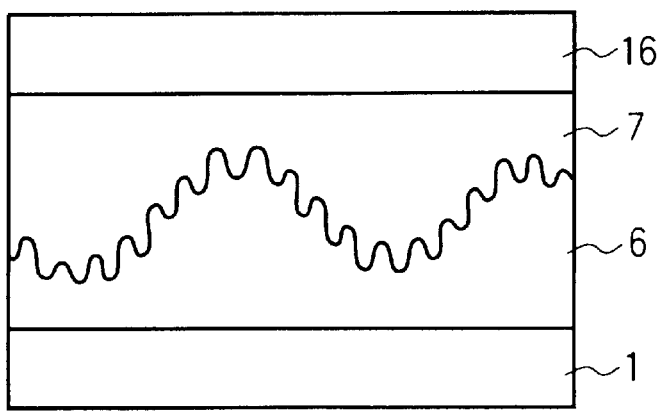
FIG. 9 is a schematic view showing the structure of the major parts of an organic solar cell according to the sixth example of the present invention.

FIG. 9 is a schematic view showing the structure of the main parts of still another example of the organic solar cell according to the first preferred embodiment of the present invention.

As shown in FIG. 9, this organic solar cell has a stacked structure including a Nesa glass substrate 1, a BCPEB film 6, a TTPAE film 7, and an aluminum electrode 16.

This organic solar cell was manufactured by the following manufacturing method according to the eighth aspect of the present invention.

First, following the same procedure as in Example 5, equal amounts of powders of BCPEB and TTPAE were mixed, and the mixture was sandwiched between a Nesa glass substrate 1 and an aluminum substrate 4 such that the spacing between the two substrates was set to 1 $\mu$m by using a spacer. The resultant structure was heated to 300° C. and cooled to room temperature at a rate of 1° C./sec while voltages of +10V and +15V were applied to the Nesa glass substrate while the temperature fell from 297° C. to 200° C. and from 200° C. to 140° C., respectively.

After the cooling, the structure between the two substrates was observed at room temperature by a sectional TEM. Consequently, a layered structure of aluminum electrode/BCPEB/TTPAE/Nesa glass was found. Since the voltage was abruptly changed in two steps, the Hausdorff dimension of the sectional contour shape of the interface between BCPEB and TTPAE was 1.8±0.1 at a scale length of 10 nm and 1.3±0.1 at a scale length of 1 $\mu$m.

Following the same procedure as in Example 1, this wet organic solar cell was irradiated with light at a light quantity of 750 mW/cm$^2$, and the resultant photoelectric conversion efficiency and the portability of the device were measured. The results are shown in Table 1 to be presented later.

Comparative Example 1

A dry organic solar cell was manufactured by stacking 100-nm thick Mg phthalocyanine, 100-nm thick PTCDA, and a 1000-nm thick Al electrode in this order on a Nesa glass substrate by vacuum evaporation.

A device section was observed with a TEM, and the Hausdorff dimension of the phthalocyanine-PTCDA interface was 1.1±0.1 at a scale length of 100 nm.

Following the same procedure as in Example 1, this wet organic solar cell was irradiated with light at a light quantity of 750 mW/cm$^2$, and the resultant photoelectric conversion efficiency and the portability of the device were measured. The results are shown in Table 1 to be presented later.

Comparative Example 2

10-$\mu$m thick TiO$_2$ fine particles with a grain size of 100 nm or less were stacked on a Nesa glass substrate and sintered at 450° C. About one molecular layer of 4-tert-butylpyridine was adsorbed on the surface of this fine particle. Thereafter, a platinum electrode was attached via an acetonitrile solution containing a ruthenium complex RuL$_2$(NCS)$_2$ and a lithium iodine/iodine anion electrolyte, thereby obtaining a wet organic solar cell.

A device section was observed with a TEM, and the Hausdorff dimension of the sectional contour shape of the fine particle interface was 1.9±0.1 at a scale length of 100 nm. However, this interface was not continuous because the interface had grain boundaries between the fine particles.

Following the same procedure as in Example 1, this wet organic solar cell was irradiated with light at a light quantity of 750 mW/cm$^2$, and the resultant photoelectric conversion efficiency and the portability of the device were measured. The results are shown in Table 1 to be presented later.

TABLE 1

|  | Hausdorff dimension (scale length) | Photoelectric conversion efficiency | Portability |
| --- | --- | --- | --- |
| Example 1 | 1.8 ± 0.1 (100 nm) | 10% | X |
| Example 2 | 1.8 ± 0.1 (10 nm), 1.3 ± 0.1 (1 $\mu$m) | 12% | X |
| Example 3 | 1.8 ± 0.1 (100 nm), 1.3 ± 0.1 (1 $\mu$m) | 12% | X |
| Example 4 | — | — | ○ |
| Example 5 | 1.8 ± 0.1 (100 nm) | 10% | ○ |
| Example 6 | 1.8 ± 0.1 (100 nm), 1.3 ± 0.1 (1 $\mu$m) | 12% | ○ |
| Comparative Example 1 | 1.1 ± 0.1 (100 nm) | 1% | ○ |
| Comparative Example 2 | 1.9 ± 0.1 (100 nm) | 8% | X |

As shown in Table 1, each of the organic solar cells according to the present invention has a very high photoelectric conversion efficiency. Examples 1 to 3 using a p-type polypyrrole film, an Mg phthalocyanine coating layer, and an aqueous electrolyte solution layer containing phosphate hexafluoride are slightly inferior in portability. However, this can be solved by performing gelation as in Example 4. When a BCPEB film and a TTPAE film are used as in Examples 5 and 6, organic solar cells superior in both portability and photoelectric conversion efficiency are obtained. In contrast, the photoelectric conversion efficiencies of the organic solar cells in Comparative Examples 1 and 2 are very low.

EXAMPLE 7

Figure 10:
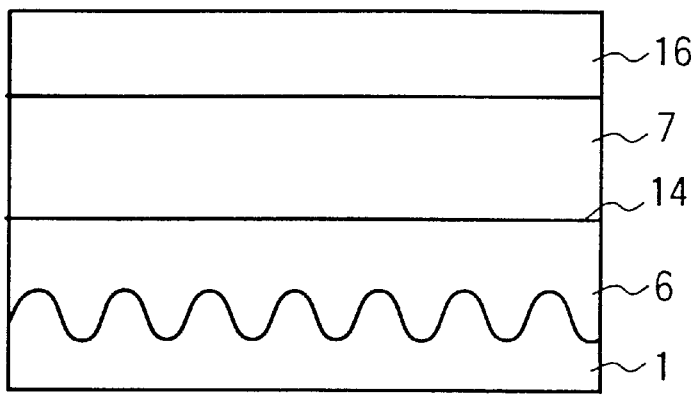
FIG. 10 is a schematic view showing the main parts of an organic EL device according to the seventh example of the present invention.

FIG. 10 is a schematic view showing the main components of an example of the organic EL device according to the second preferred embodiment of the present invention.

As shown in FIG. 10, this EL device has a stacked structure including a Nesa glass substrate 1, a TTPAE layer 6, an Alq$_3$ (aluminum quinolyl) layer, a TCPEB layer 7, and an aluminum electrode 16. The surface of the Nesa glass substrate 1 on the side of the TTPAE layer 6 has a structure covered with micropores.

This EL device was manufactured as follows.

First, plasma etching was performed on the surface of the Nesa glass substrate 1 to obtain a structure covered with micropores. The Hausdorff dimension of the contour shape in the section of this structure was 1.8±0.1 at a scale length of 10 nm.

After a 100-nm thick TTPAE 6 was stacked on a Nesa glass substrate 1, 10-nm thick Alq$_3$ and a 100-nm thick TCPEB 7 were stacked on the TTPAE 6. An aluminum thin film 16 having a thickness of about 1 $\mu$m was vapor-deposited on top of the TCPEB 7 to form an organic EL device.

The resultant EL device operates by hole injection from the Nesa glass substrate into the TTPAE layer and electron injection from the aluminum electrode into the Alq$_3$ layer, hole transfer in the TTPAE layer and electron transfer in the Alq$_3$ layer, recombination of electrons and holes in the interface between the TTPAE layer and the Alq$_3$ layer, and subsequent production of excitons and light emission by the excitons. The Hausdorff dimension D of the sectional contour shape of the surface of the Nesa glass substrate can take a value of 1.0<D<2.0 at a scale length of 10 nm. Since D takes a value of 1.8±0.1, the efficiency of hole injection from the Nesa glass substrate into the TTPAE layer rises, and this improves the luminous efficiency.

The Hausdorff dimension (scale length) and the luminous efficiency of the above organic EL device were checked. The results are shown in Table 2 below.

Comparative Example 3

By using a vacuum evaporation process, 100-nm thick TTPAE was stacked on a flat Nesa glass substrate, and 10-nm thick $Alq_3$ and 100-nm thick TCPEB were stacked on the TTPAE. An aluminum thin film having a thickness of about 1 μm was vapor-deposited on the TCPEB to form an organic EL device.

Following the same procedure as in Example 7, the Hausdorff dimension (scale length) and the luminous efficiency of the resultant organic EL device were checked. The results are shown in Table 2 below.

TABLE 2

| | Hausdorff dimension (scale length) | EL luminous efficiency |
|---|---|---|
| Example 7 | 1.8 ± 0.1 (10 nm) | 5% |
| Comparative Example 3 | 1.1 ± 0.1 (10 nm) | 2% |

As shown in Table 2, the EL light-emitting device according to the present invention has an EL luminous efficiency twice or more that of the conventional EL light-emitting device.

EXAMPLE 8

Figure 11:
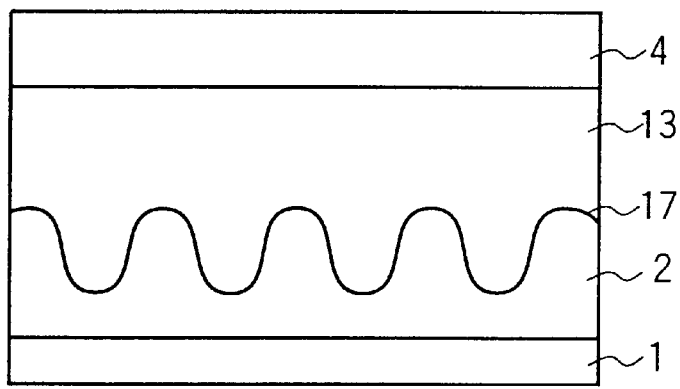
FIG. 11 is a schematic view showing the major components of an electrochromic display device according to the eighth example of the present invention.

FIG. 11 is a schematic view showing the major parts of an example of the electrochromic display device according to the third preferred embodiment of the present invention.

As shown in FIG. 11, this electrochromic display device has a stacked structure including a Nesa glass substrate 1, a p-type polypyrrole film 2, and a Nesa. glass electrode 4 formed via a solution layer 13 containing 5 mM of a quinone dye in 0.1 M $H_2SO_4$. The surface of the p-type polypyrrole film 2 on the side of the solution layer 13 has dendritic structures a few tens of μm high.

This electrochromic display device was manufactured as follows.

First, a p-type polypyrrole film 2 was formed on a Nesa glass substrate 1 by field polymerization by using the Nesa glass substrate 1 as a work electrode (positive electrode), a platinum electrode as a counter electrode (negative electrode), a saturated calomel electrode as a reference electrode, and phosphate hexafluoride as an electrolyte. The conditions of field polymerization were so set that the applied voltage was 5.0V and the film thickness of the polypyrrole film 2 was about 10 μm. When a section of the grown polypyrrole film was observed with a TEM, dendritic structures 17 a few tens of μm high were found.

The Hausdorff dimension of the contour shape in a section of the surface of the dendritic structures 17 calculated by a computer was 1.8±0.1 at a scale length of 10 μm. A solution containing 5 mM of a quinone dye in 0.1 M $H_2SO_4$ was placed between this high polymer thin film and the platinum electrode to obtain an electrochromic display device.

The resultant electrochromic display device generates a color by negative ionization of the quinone dye on the surface of the platinum electrode, diffusion of the quinone dye ions into the electrolyte, and adsorption of the quinone dye ions to the surface of the high polymer thin film. Also, this electrochromic display device extinguishes a color by elimination of the quinone dye from the surface of the high polymer thin film upon application of a negative voltage to the surface of the high polymer thin film. The Hausdorff dimension D of the sectional contour shape of the surface of the high polymer thin film can take a value of 1.0<D<2.0 at a scale length of 10 μm. Since D takes 1.8±0.1, the adsorption of the quinone dye ions to the surface of the high polymer thin film is accelerated during color generation, and the elimination of the quinone dye from the surface of the high polymer thin film is accelerated during color extinguishment. Consequently, the color generating and extinguishing rates are improved.

The Hausdorff dimension (scale length) of the sectional contour shape of the interface of the resultant electrochromic display device was measured. Also, the color generating rate of the device was measured by applying a voltage of +0.8V to the high polymer thin film. The results are shown in Table 3 to be presented later.

Comparative Example 4

An electrochromic display device was manufactured following the same procedures as in Example 8 except that a voltage of 3.0V, instead of 5.0V, was applied during field polymerization.

When a section of a polypyrrole film was observed with a TEM, a flat surface structure was found. The Hausdorff dimension of the sectional contour shape in the section of the polypyrrole film calculated by a computer was 1.2±0.1 at a scale length of 10 μm.

The color generating rate of the resultant electrochromic display device was measured by applying a voltage of +0.8V to a high polymer thin film as in Example 8. The results are shown in Table 3.

EXAMPLE 9

Figure 12:
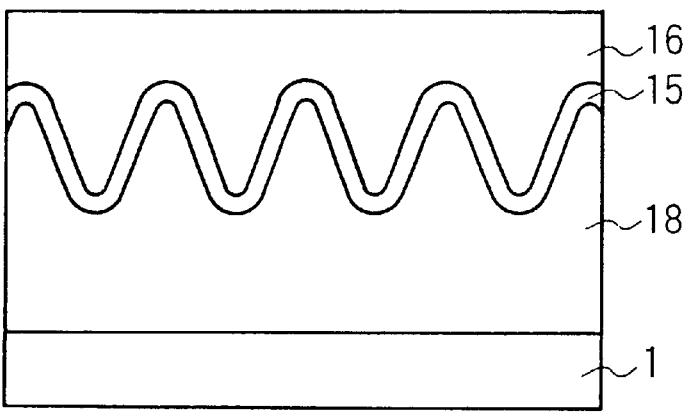
FIG. 12 is a schematic view showing the main parts of a light-emitting electrochemical device according to the ninth example of the present invention.

FIG. 12 is a schematic view showing the major parts of an example of the electrochemical light-emitting device according to the fourth preferred mode of the present invention.

As shown in FIG. 12, this electrochemical light-emitting device has a stacked structure of a Nesa glass substrate 1, a polyphenylenevinylene film 18, and an aluminum electrode 16. The interface between the polyphenylenevinylene film 18 and the aluminum electrode 16 has dendritic structures a few tens of μm high.

This electrochemical light-emitting device was manufactured as follows.

First, a polyphenylenevinylene film 18 was formed on a Nesa glass substrate 1 by field polymerization by using the Nesa glass substrate 1 as a work electrode (positive electrode), a platinum electrode as a counter electrode, a saturated calomel electrode as a reference electrode, and phosphate hexafluoride as an electrolyte. The conditions of field polymerization were so set that the applied voltage was 5.0V and the film thickness of the polyphenylenevinylene film 18 was about 100 μm. When a section of the grown polyphenylenevinylene film 18 was observed with a TEM, dendritic structures 19 a few tens of μm high were found.

The Hausdorff dimension of the contour shape in the section of the surface of the polyphenylenevinylene film 18 calculated by a computer was 1.8±0.1 at a scale length of 10 μm. A thin film of laser dye Kiton red 620 having a film thickness of about 1 μm was grown on the surface of this high polymer thin film 18 by a coating process. Thereafter, the high polymer thin film 18 was covered with the aluminum electrode 16 by vacuum evaporation to obtain an electrochemical light-emitting device.

The resultant light-emitting electrochemical device operates by transfer of holes produced on the Nesa glass surface and electrons produced on the aluminum electrode surface, upon application of a voltage, in the polyphenylenevinylene layer, production of excitons by recombination of the electrons and holes in the dye layer or the polyphenylenevinylene layer, and emission of light by the excitons. Since the Hausdorff dimension D of the sectional shape of the polyphenylenevinylene surface has dendritic structures a few tens of μm high, diffusion of holes produced on the aluminum electrode surface to the dye layer or the polyphenylenevinylene layer is accelerated. This improves the luminous efficiency.

Table 3 shows a luminous response rate obtained by applying a voltage of 5.0V to the high polymer thin film of the resultant light-emitting electrochemical device.

Comparative Example 5

An electrochemical light-emitting device was manufactured following the same procedures as in Example 9 except that a voltage of 3.0V, instead of 5.0V, was applied during field polymerization. When a section of a polyphenylenevinylene film was observed with a TEM, a flat surface structure was found. The Hausdorff dimension of the contour shape in the section of the surface of the polyphenylenevinylene film calculated by a computer was 1.2±0.1 at a scale length of 10 μm. Table 3 shows the Hausdorff dimensions (scale lengths) of the interfaces of the light-emitting electrochemical devices obtained in Example 9 and Comparative Example 5 and the luminous response rates of these devices obtained by applying a voltage of 5.0V to the high polymer thin films of the devices.

EXAMPLE 10

Figure 13:
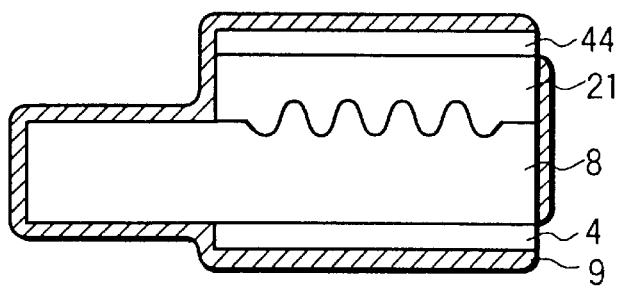
FIG. 13 is a schematic view showing the main components of a gel actuator according to the tenth example of the present invention.

FIG. 13 is a schematic view showing the main components of an embodiment of the gel actuator according to the fifth preferred embodiment of the present invention.

As shown in FIG. 13, this gel actuator has a structure including a stacked material which includes a pair of electrodes 4 and 44, a bar-like polymer gel 8 formed on the surface of the electrode 4 between the two electrodes 4 and 44, and an electrolyte solution 21 such as $Na_2CO_3$ formed between the bar-like high polymer gel 8 and the electrode 44, and an elastic material 9 formed around this stacked material. The surface of the bar-like polymer gel 8 on the side of the electrolyte solution 21 has a number of micropores.

This gel actuator was manufactured as follows.

First, a high polymer gel made from polyvinyl alcohol and polyacrylic acid was formed into a bar about 5 mm in diameter and about 3 cm in length.

An etching treatment such as an acid treatment was performed for a portion about 2 cm from the end of the resultant bar-like polymer gel, thereby forming micropores in the surface of the bar-like high polymer gel.

The Hausdorff dimension in the section of this fine hole was 1.8±0.1 at a scale length of 10 μm. The portion of the bar-like polymer gel where these micropores were formed was dipped into an electrolyte solution such as $Na_2CO_3$ to form a electrolyte solution layer 21 and electrodes 4 and 44 via a bar-like high polymer gel 8. The entire structure was covered with an elastic material 9 to form a gel actuator.

The resultant gel actuator operates by doping of the electrolyte into the high polymer gel upon application of a voltage to the electrode and a resultant change in the volume of the polymer gel. The Hausdorff dimension D of the sectional shape of the high polymer gel surface can take a value of 1.0<D<2.0 at a scale length of 10 μm. Since D takes a value of 1.8±0.1, the rate of doping of the electrolyte into the polymer gel improves, and this improves the operating rate of the actuator.

The Hausdorff dimension (scale length) of the interface of this actuator was measured. Also, the operating rate of the actuator was measured by applying a pulse voltage of ±20V to the device. The results are shown in Table 3.

Comparative Example 6

A gel actuator was manufactured following the same procedures as in Example 10 except that no etching treatment was performed for a bar-like high polymer gel.

Following the same procedures as in Example 10, the Hausdorff dimension (scale length) of the resultant actuator was measured, and the operating rate of the actuator was measured by applying a pulse voltage of ±20V to the device. The results are shown in Table 3 below.

TABLE 3

|  | Hausdorff dimension (scale length) | Rates of color generation, light emission, and operation of device |
| --- | --- | --- |
| Example 9 | 1.8 ± 0.1 (10 nm) | 0.01 s |
| Comparative Example 5 | 1.2 ± 0.1 (10 nm) | 1 to 5 s |
| Example 10 | 1.8 ± 0.1 (10 nm) | 1 s |
| Comparative Example 6 | 1.2 ± 0.1 (10 nm) | 50 to 100 s |
| Example 11 | 1.8 ± 0.1 (10 nm) | 0.1 s |
| Comparative Example 7 | 1.2 ± 0.1 (10 nm) | 10 s |

As is apparent from Table 3, the electrochromic display device, the electrochemical light-emitting device, and the gel actuator according to the present invention are superior to the conventional devices in light emitting rate, luminous response rate, and operating rate.

EXAMPLE 11

Figure 14:
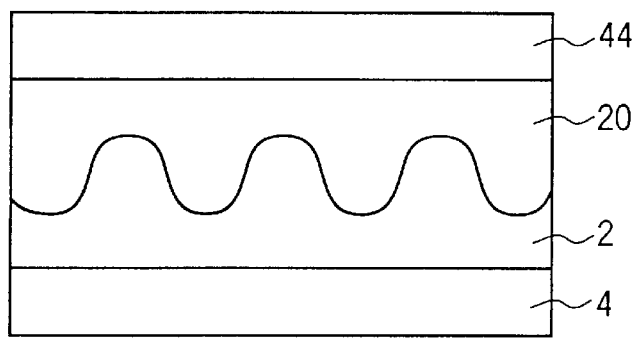
FIG. 14 is a schematic view showing the major parts of a thin film secondary battery according to the eleventh example of the present invention.

FIG. 14 is a schematic view showing the major parts of an example of the thin film secondary battery according to the sixth preferred embodiment of the present invention.

As shown in FIG. 14, this thin film secondary battery has a stacked structure including a pair of platinum electrodes 4 and 44, a polypyrrole film 2 formed on the surface of the platinum electrode 4 between the two electrodes 4 and 44, and a polyethylene oxide powder layer 20 formed between the polypyrrole film 2 and a nickel electrode 21 and containing vanadium oxide. The interface between the polypyrrole film 2 and the polyethylene oxide powder layer 20 containing vanadium oxide has dendritic structures a few hundred μm high.

This thin film secondary battery was manufactured as follows.

First, polypyrrole was formed on a work electrode 4 by field polymerization by using platinum electrodes as the work electrode 4 (positive electrode) and a counter electrode (negative electrode), a saturated calomel electrode as a reference electrode, and a lithium salt as an electrolyte. The conditions of field polymerization were so set that the applied voltage was 5.0V and the film thickness of the polypyrrole film was about 100 µm.

When a section of the grown surface was observed with a TEM, dendritic structures a few hundred µm high were found. The Hausdorff dimension in the section calculated by a computer was 1.8±0.1 at a scale length of 10 µm.

A polyethylene oxide powder coating layer 20 containing vanadium oxide was formed on this high polymer thin film. A nickel electrode plate 44 was formed on the layer 20 to complete a thin film secondary battery.

The resultant thin film secondary battery is charged by diffusion of the lithium salt in the polyethylene oxide powder coating layer into the polypyrrole thin film upon application of a negative voltage to the polypyrrole thin film, and subsequent doping. The thin film secondary battery discharges by generation of positive electric charge by dedoping of the lithium salt from the polypyrrole thin film, and diffusion of the lithium salt from the surface of the polypyrrole thin film into the polyethylene oxide powder coating layer. Since the shape of the polypyrrole thin film surface is a set of dendritic structures 100 µm or more in height, the rate of diffusion of the lithium salt from the polyethylene oxide powder coating layer into the polypyrrole thin film is improved in charging, and the rate of diffusion of the lithium salt from the polypyrrole thin film surface into the polyethylene oxide powder coating layer is improved in discharging. Also, the doping amount per unit area on the electrode surface increases. The result is an improved current capacitance density.

The negative electrode capacitance density of this thin film secondary battery was measured by a voltage drop measurement using a constant-current power supply and a voltage recorder. The result is shown in Table 4.

Comparative Example 7

A thin film secondary battery was manufactured following the same procedures as in Example 11 except that a voltage of 3.0V, instead of 5.0V, was applied during field polymerization.

Table 4 below shows the Hausdorff dimensions (scale lengths) of the interfaces of the thin film secondary batteries manufactured in Comparative Example 8 and Example 11 and the negative electrode capacitance densities of these batteries.

TABLE 4

|  | Hausdorff dimension (scale length) | Negative electrode capacitance density |
| --- | --- | --- |
| Comparative Example 8 | 1.2 ± 0.1 (10 nm) | 10 Ah/kg |
| Example 12 | 1.8 ± 0.1 (100 nm) | 200 Ah/kg |

As can be seen from Table 4, the thin film secondary battery according to the present invention has a higher negative electrode capacitance density than that of the conventional battery.

EXAMPLE 12

Figure 15:
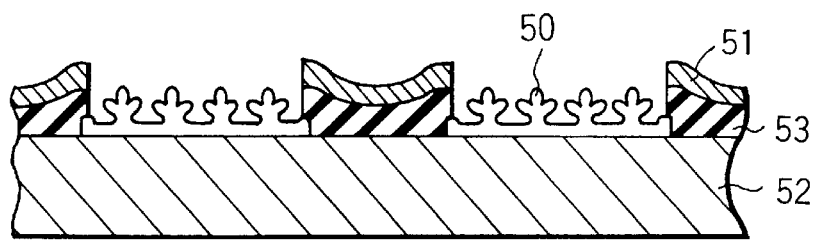
FIG. 15 is a schematic view showing an example of a field emission device according to the third aspect of the present invention.

FIG. 15 is a schematic view showing the major components of an embodiment of the field emission device according to the fourth aspect of the present invention.

As shown in FIG. 15, this field emission device has a stacked structure including a substrate 52, an electron emitter layer 40 formed into a predetermined pattern on the substrate 52, an insulator layer 53 formed on the substrate and having openings in regions where the electron emitter layer 50 is formed, and a gate electrode layer 4 formed on the insulator layer 53.

This field emission device is manufactured as follows.

It is desirable that the substrate contain a material such as gas, ceramic, or silicon. An electron emitter material layer is stacked into a desired pattern on the surface of the substrate. Examples of the material of this electron emitter layer are metals such as Mo, W, and Cs, compounds such as $LaB_6$, $YB_6$, and AlN, and combinations of these materials. The surface of the electron emitter layer is etched by a plasma etching process or an electrochemical method. Alternatively, plating is performed for the electron emitter layer if the layer contains a metal such as Mo, W, or Cs. Consequently, a set of dendritic structures is formed on the surface of the electron emitter layer. This dendritic structure is surrounded by a plurality of branches having sharp peripheral portions. Concentration of electric field at the tips of these sharp portions is used in electron emission at low voltages.

An insulator layer having openings is formed on the resultant electron emitter layer by conventional mask processing, and a gate electrode layer is formed on the insulator layer. Examples of the material of the insulator layer are $SiO_2$, glass, ceramic, and combinations of these materials. Examples of the material of the gate electrode layer are metals such as Cu, Cr, Ni, Nb, Mo, and W, and alloys of these metals.

The field emission device thus manufactured has a set of dendritic structures with a plurality of sharp portions on the surface of the electron emitter layer exposed in one opening of the gate electrode layer and the insulator layer, and these sharp portions function as electron emission points. Accordingly, the device can have a large number of electron emission points in one opening. Also, dendritic structures are formed in a self-organization manner, rather than by conventional processing such as mask processing. Therefore, sharp structures can be obtained by a simpler method.

Figure 16:
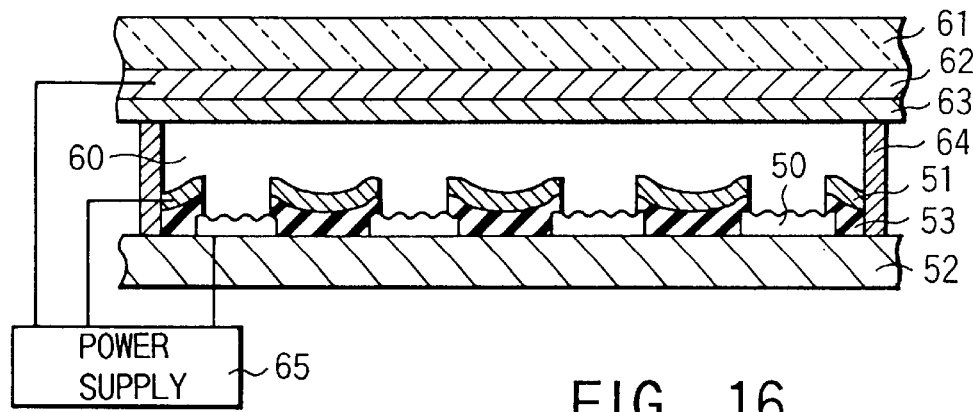
FIG. 16 is a schematic view showing a display apparatus using the device in FIG. 15.

As shown in FIG. 16, a flat panel display can be manufactured by stacking a phosphor layer 63, an anode layer 62, and a transparent insulating substrate 61 on the resultant field emission device by using a spacer 64 so that a predetermined distance is formed between the device and these layers. Vacuum 60 is formed between the phosphor layer 63 and the field emission device, and power is supplied to the electron emitter layer 50, the gate electrode layer 51, and the anode layer 62 as indicated by reference numeral 65. This can make the emitter emit electrons.

As the anode layer 62, a transparent conductor such as indium or tin oxide is generally used. As the transparent insulating substrate, glass is generally used. The applied electric field is usually 50 V/µm or less, preferably 25 V/µm or less, and more preferably 15 V/µm or less between the electron emitter layer and the gate electrode. The field-emitted electrons from the electron emitter layer which is activated by field application reach the phosphor layer through the vacuum to make the layer emit light, and then reach the anode layer.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. An electronic device which is used as an organic thin film device comprising a first electrode, a layer formed on said first electrode and containing an organic material, and a second electrode formed on said organic material containing layer, wherein said organic material containing layer has an interface to an adjacent layer comprising an aggregation of dendritic structures with a cross-section of a portion of said interface having contour shape of Hausdorff dimension D falling within the range $1.5 \leq D \leq 2$ at a scale length of 10 μm.

2. A device according to claim 1 which is applied as a photoelectric conversion apparatus, wherein said Hausdorff dimension D falls within the range $1.7 \leq D \leq 2.0$, and said organic material containing layer adsorbs or emits electrons in the interface.

3. A device according to claim 1 which is applied as an electrochemical apparatus, wherein the Hausdorff dimension D falls within the range $1.5 \leq D \leq 2.0$, and said organic material containing layer adsorbs or emits ions in the interface.

4. A device according to claim 3 which is used as an electrochromic display device, wherein said organic material containing layer contains an electrolyte layer and a polymer layer formed on said electrolyte layer, and a section of the interface between the electrolyte layer and the polymer layer has Hausdorff dimension D within the range $1.7 \leq D \leq 2.0$ at a scale length of 10 μm.

5. A device according to claim 3 which is used as a light-emitting electrochemical device, wherein said organic material containing layer contains a mixed layer of a polymer and an electrolyte, wherein the interface between said first electrode and said mixed layer is continuous, and the contour shape of the interface in a section of said light-emitting electrochemical device has Hausdorff dimension D falling within the range $1.7 \leq D \leq 2.0$ at a scale length of 10 μm.

6. A device according to claim 3 which is used as a thin film secondary battery, wherein said organic material containing layer contains an electrolyte layer and a polymer gel layer, the contour shape of the interface between said electrolyte layer and said polymer gel layer in a section of said organic material containing layer is a set of dendritic structures not less than 10 μm in height and has Hausdorff dimension D falling within the range $1.7 \leq D \leq 2.0$ at a scale length of 10 μm.

7. An organic solar cell comprising:
a first electrode;
a layer formed on said first electrode and containing an organic material; and
a second electrode formed on the organic material-containing layer, wherein said organic material-containing layer contains first and second organic layers having a continuous interface between said first and second organic layers, wherein the contour shape of a section of the interface has Hausdorff dimension D falling within the range $1.7 \leq D \leq 2.0$ at a scale length of 100 nm, and wherein said organic material containing layer adsorbs or emits electrons in the interface.

8. The device of claim 7, wherein said continuous interface has a shape composed of an aggregation of a plurality of pyramids, wherein each of the plurality of pyramids has a bottom surface width of not less than 10 μm.

9. An organic EL device comprising:
a first electrode;
a layer formed on said first electrode and containing an organic material that adsorbs or emits electrons; and
a second electrode formed on the organic material-containing layer, wherein said organic material-containing layer contains an n-type organic layer and a p-type organic layer formed on said n-type organic layer, at least one of a first interface between said first electrode and said n-type organic layer and a second interface between said second electrode and said p-type organic layer is continuous, wherein the contour shape of the continuous interface has Hausdorff dimension D falling within the range $1.7 \leq D \leq 2.0$ at a scale length of 10 nm, and wherein said organic material containing layer adsorbs or emits electrons in the interface.

10. A gel actuator comprising:
a first electrode;
a layer formed on said first electrode and containing an organic material that adsorbs or emits ions; and
a second electrode formed on the organic material-containing layer, wherein said organic material-containing layer contains an electrolyte layer and a polymer gel layer, said gel actuator having a stacked structure including said first electrode, said second electrode, and an elastic material formed around said stacked structure, and the contour shape of the interface between said electrolyte layer and said polymer gel layer in a section of said organic material-containing layer has Hausdorff dimension D falling within the range $1.5 \leq D \leq 2.0$ at a scale length of 1 μm, and wherein said organic material containing layer adsorbs or emits ions in the interface.

* * * * *